United States Patent [19]

Dinan

[11] Patent Number: 4,689,650
[45] Date of Patent: Aug. 25, 1987

[54] INFRARED EPITAXIAL DETECTOR STRUCTURE AND METHOD OF MAKING SAME

[75] Inventor: John H. Dinan, Alexandria, Va.

[73] Assignee: The United States of America as represented by the Secretary of the Army, Washington, D.C.

[21] Appl. No.: 783,702

[22] Filed: Oct. 3, 1985

[51] Int. Cl.$^4$ .................. H01L 27/14; H01L 31/00
[52] U.S. Cl. ........................ 357/30; 357/16; 357/61
[58] Field of Search ........... 357/30, 30 B, 16, 31, 357/32, 61

[56] References Cited

U.S. PATENT DOCUMENTS

| | | | |
|---|---|---|---|
| 3,218,203 | 11/1965 | Ruehrwein | 357/30 E X |
| 4,369,372 | 1/1983 | Yoshioka et al. | 357/32 X |
| 4,553,152 | 11/1985 | Nishitani | 357/16 X |

FOREIGN PATENT DOCUMENTS

| | | | |
|---|---|---|---|
| 5224483 | 2/1977 | Japan | 357/30 B |
| 0603165 | 1/1985 | Japan | 357/30 B |

OTHER PUBLICATIONS

Levinstein, "Infrared Detectors", *Physics Today*, Nov. 1977, pp. 23-28.

Primary Examiner—Andrew J. James
Assistant Examiner—W. A. Mintel
Attorney, Agent, or Firm—Max L. Harwell; Aubrey J. Dunn; Anthony T. Lane

[57] ABSTRACT

Successive layers of a II-VI ternary buffer layer and a II-VI ternary narrow-bandpass infrared-absorbing layer are grown by MBE on a III-V binary substrate with low surface defect density. The composition of the buffer layer is chosen to lattice match with the infrared-absorbing layer.

3 Claims, 1 Drawing Figure

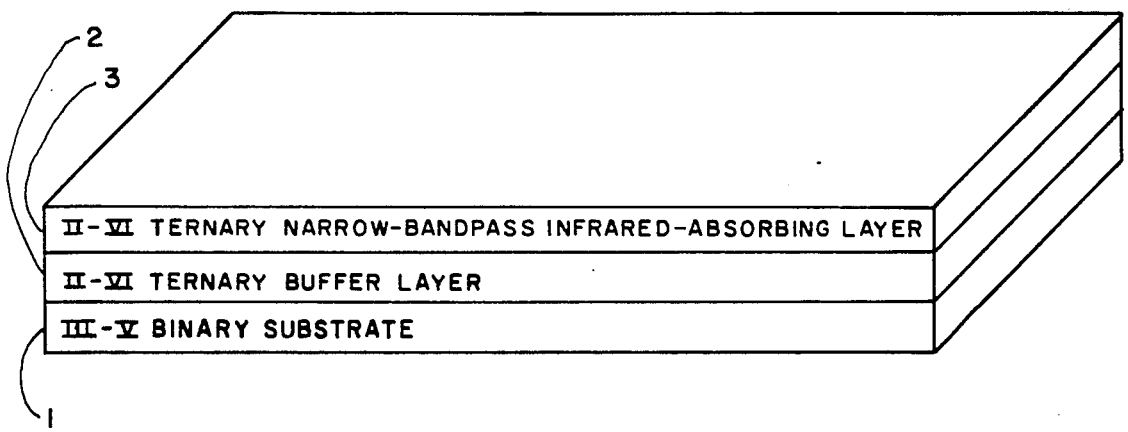

INFRARED EPITAXIAL DETECTOR STRUCTURE AND METHOD OF MAKING SAME

The invention described herein may be manufactured, used, and licensed by the U.S. Government for governmental purposes without the payment of any royalties thereon.

BACKGROUND OF THE INVENTION

This invention is in the field of semiconductor infrared detectors. In particular, it is concerned with those detectors wherein an optical absorbing layer is deposited on a substrate, and wherein the substrate is lattice matched to the layer. The desire has existed for a detector in the 3-5 or 8-14 micron spectral region using a narrow bandgap absorbing material such as HgCdTe or HgZnTe on a wider bandgap substrate. An ideal substrate will not only be lattice matched to the absorbing material, but will have negligable defect density. Unfortunately, no substrate material has been found which satisfies both these requirements. The currently available compound semiconductor materials which may be produced with low defect density are III-V compounds such as InSb or GaAs. Obviously, lattice matching to HgCdTe or HgZnTe is not possible with such compounds. In order to achieve lattice matching with HgCdTe or HgZnTe, one must use II-VI compounds such as ZnCdTe. The defect densities of such II-VI compounds, however, are three orders of magnitude higher than III-V compounds. The instant invention is a solution to this dilemma.

SUMMARY OF THE INVENTION

The invention is a unique infrared epitaxial detector and a method of making such a detector. The detector consists of a low defect-density III-V binary substrate covered with a buffer layer of II-VI ternary material preferably deposited by molecular beam epitaxy (MBE). A II-VI ternary narrow-bandpass infrared-absorbing layer is preferably deposited also by MBE. The substrate may be GaAs, but is preferably InSb, and the buffer layer is $Zn_xCd_{1-x}Te$ of appropriate composition to lattice match the infrared absorbing layer.

BRIEF DESCRIPTION OF THE DRAWINGS

The single drawing FIGURE is a schematic showing of a detector made in accordance with the invention.

DESCRIPTION OF PREFERRED EMBODIMENTS OF THE INVENTION

The invention may be best understood when this description is taken in conjunction with the drawing. Referring now to the drawing, we see that layer 1 is a III-V binary substrate. This substrate should be in the form of a single crystal wafer of large area and low defect density; InSb is an ideal candidate, since it is available in diameters of 1.5 inches, and with etch pit density less than 100 per $cm^2$. Buffer layer 2 is a ZnCdTe compound, with the zinc concentration adjusted to lattice match the compound to infrared-absorbing layer 3. This layer 3 is a II-VI compound with a narrow-bandgap infrared response. Depending on whether one is interested in 3-5 or 8-14 micron portions of the spectrum, HgCdTe or HgZnTe may be chosen.

The method of the invention is straight forward: substrate 1 is prepared in the usual manner of preparing a semiconductor crystal slab, and the layers 2 and 3 are grown to the desired compositions and thickness and compositions by MBE. Typical compositions and thicknesses are as follows: HgCdTe, the buffer layer should be $Zn_{0.045}Cd_{0.955}Te$, and for HgZnTe, the buffer layer should be $Zn_{0.2}Cd_{0.8}Te$; each buffer layer is approximately 1 micron thick, and the infrared-absorbing layer is approximately 10 microns thick. Obviously, substrate thickness is not important, but is normally several mils.

While no mention has been made of output leads for the device, it should be understood that such leads will be applied in the typical techniques used for semiconductor detectors. That is, the device may be masked and etched to delineate individual detector elements, and output leads may be bonded or deposited to such elements.

I claim:

1. An infrared detector structure including:
   a III-V binary substrate chosen from the group consisting of GaAs and In-Sb;
   a ternary II-VI buffer layer of a $Zn_xCd_{1-x}Te$ compound atop said substrate;
   a II-VI narrow-bandpass ternary infrared-absorbing layer chosen from the group consisting of HgCdTe and HgZnTe atop said buffer layer, wherein said buffer layer is lattice matched to said infrared absorbing layer.

2. The detector structure as set forth in claim 1 wherein the buffer layer is $Zn_{0.045}Cd_{0.955}Te$ when HgCdTe is chosen as the infrared-absorbing layer.

3. The detector structure as set forth in claim 1 wherein the buffer layer is $Zn_{0.2}Cd_{0.8}Te$ when HgZnTe is chosen as the infrared-absorbing layer.

* * * * *